US012453005B1

(12) United States Patent
Cheng et al.

(10) Patent No.: US 12,453,005 B1
(45) Date of Patent: Oct. 21, 2025

(54) LAMINATED UNIT FOR PRINTED CIRCUIT BOARD AND PRINTED CIRCUIT BOARD

(71) Applicant: Beijing Zitiao Network Technology Co., Ltd., Beijing (CN)

(72) Inventors: Chuansheng Cheng, Beijing (CN); Dayong Shen, Beijing (CN); Jian Wang, Beijing (CN)

(73) Assignee: Beijing Zitiao Network Technology Co., Ltd., Beijing (CN)

( * ) Notice: Subject to any disclaimer, the term of this patent is extended or adjusted under 35 U.S.C. 154(b) by 0 days.

(21) Appl. No.: 19/002,547

(22) Filed: Dec. 26, 2024

(30) Foreign Application Priority Data

Apr. 3, 2024 (CN) .......................... 202410405267.2

(51) Int. Cl.
*H05K 1/02* (2006.01)
*H05K 1/03* (2006.01)

(52) U.S. Cl.
CPC ... *H05K 1/0366* (2013.01); *H05K 2201/0183* (2013.01); *H05K 2201/029* (2013.01); *H05K 2201/0338* (2013.01); *H05K 2201/09309* (2013.01)

(58) Field of Classification Search
CPC ........... H05K 1/0366; H05K 2201/029; H05K 2201/0293
See application file for complete search history.

(56) References Cited

U.S. PATENT DOCUMENTS

2019/0306993 A1* 10/2019 Kim .................. B32B 15/20

FOREIGN PATENT DOCUMENTS

| CN | 102548183 A | 7/2012 |
|---|---|---|
| CN | 103813614 A | 5/2014 |
| CN | 112911805 A | 6/2021 |
| CN | 116828694 A | 9/2023 |
| CN | 117460144 A | 1/2024 |
| CN | 119031569 A | 11/2024 |
| JP | 2013-131526 A | 7/2013 |
| JP | 2017-069320 A | 4/2017 |

OTHER PUBLICATIONS

International Patent Application No. PCT/CN2024/141645; Int'l Search Report; dated Feb. 26, 2025; 5 pages.

* cited by examiner

*Primary Examiner* — Jeremy C Norris

(74) *Attorney, Agent, or Firm* — BakerHostetler

(57) ABSTRACT

According to embodiments of the present disclosure, a laminated unit for a printed circuit board and a printed circuit board are provided. The laminated unit includes a plurality of metal layers and a plurality of dielectric layers alternately stacked in a thickness direction, wherein the plurality of metal layers include a signal transmission layer and a pair of reference layers disposed on two sides of the signal transmission layer; at least one of two dielectric layers adjacent to the signal transmission layer is arranged as a resin isolation layer; and the dielectric layers on sides of the pair of reference layers opposite to the signal transmission layer are arranged as reinforcing layers, and the reinforcing layers include a substrate and a resin material arranged around the substrate.

15 Claims, 3 Drawing Sheets

LAMINATED UNIT FOR PRINTED CIRCUIT BOARD AND PRINTED CIRCUIT BOARD

CROSS-REFERENCE

The present application claims priority to Chinese Patent Application No. 202410405267.2, filed on Apr. 3, 2024, and entitled "LAMINATED UNIT FOR PRINTED CIRCUIT BOARD AND PRINTED CIRCUIT BOARD", the entirety of which is incorporated herein by reference.

FIELD

Example embodiments of the present disclosure relate generally to the field of printed circuit boards, and in particular to a laminated unit for a printed circuit board and a printed circuit board.

BACKGROUND

Current printed circuit boards (PCBs) can ensure uniform and stable transmission quality when transmitting low-speed and low-frequency digital signal. As the demand for high-speed signal continues to rise, circuit design for high-speed signal transmission for the printed circuit boards faces more serious challenge of signal integrity.

Especially in large-size devices, the high-speed signal leads to difficulties such as multiple restrictions on laminated design of PCB as well as difficulties in optimization of signal quality and the like due to high wiring density, high routing density, and more and heavier circuit board components.

SUMMARY

In a first aspect of the present disclosure, a laminated unit for a printed circuit board is provided. The laminated unit includes a plurality of metal layers and a plurality of dielectric layers alternately stacked in a thickness direction, wherein the plurality of metal layers include a signal transmission layer and a pair of reference layers disposed on two sides of the signal transmission layer; at least one of two dielectric layers adjacent to the signal transmission layer includes a resin isolation layer; and the dielectric layers on the sides of the pair of reference layers opposite to the signal transmission layer include a reinforcing layer, and the reinforcing layer includes a substrate and a resin material arranged around the substrate.

In a second aspect of the present disclosure, a printed circuit board is provided. The printed circuit board includes a plurality of laminated units provided according to the first aspect of the present disclosure, and the plurality of laminated units are stacked in the thickness direction.

It should be understood that the content described in this content section is not intended to limit the key features or important features of the embodiments of the present disclosure, nor is it intended to limit the scope of the present disclosure. Other features of the present disclosure will become readily understood from the following description.

BRIEF DESCRIPTION OF DRAWINGS

The above and other features, advantages, and aspects of various embodiments of the present disclosure will become more apparent from the following detailed description taken in conjunction with the accompanying drawings. In the drawings, the same or similar reference numbers refer to the same or similar elements, wherein.

Figure 1:
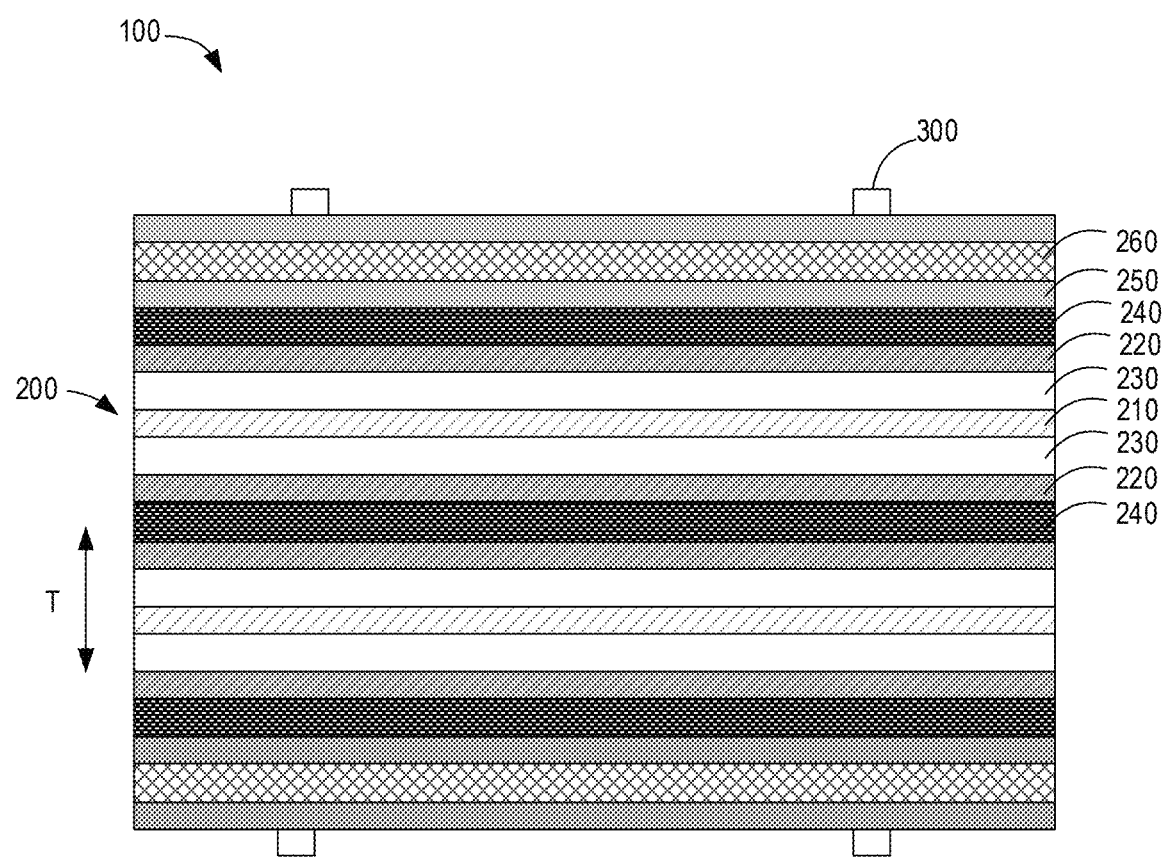
FIG. 1 illustrates a cross-sectional view of a printed circuit board according to some embodiments of the present disclosure.

Reference numerals indicate:
100 printed circuit board;
200 laminated unit;
210 signal transmission layer;
220 reference layer;
230 resin isolation layer;
240 reinforcing layer;
250 power layer;
260 structural layer;
300 reinforcing rib.

DETAILED DESCRIPTION

Embodiments of the present disclosure will be described in more detail below with reference to the accompanying drawings. While certain embodiments of the present disclosure are shown in the accompanying drawings, it should be understood that the present disclosure may be implemented in various forms, and should not be construed as limited to the embodiments set forth herein, but rather, these embodiments are provided for a more thorough and complete understanding of the present disclosure. It should be understood that the drawings and embodiments of the present disclosure are for exemplary purposes only and are not intended to limit the scope of the present disclosure.

It should be noted that the title of any section/subsection provided herein is not limiting. Various embodiments are described throughout and any type of embodiments may be included in any section/subsection. Furthermore, the embodiments described in any section/subsection may be combined in any manner with any other embodiment described in the same section/subsection and/or different sections/subsections.

In the description of the embodiments of the present disclosure, the terms "including" and the like should be understood to include "including but not limited to". The term "based on" should be understood as "based at least in part on". The terms "an embodiment" or "the embodiment" should be understood as "at least one embodiment". The term "some embodiments" should be understood as "at least some embodiments". Other explicit and implicit definitions may also be included below. The terms "first", "second", and the like may refer to different or identical objects. Other explicit and implicit definitions may also be included below.

As briefly mentioned above, current printed circuit boards (PCBs) are not suitable for high-speed and high-frequency data transmission. Specifically, the dielectric layer of the conventional printed circuit board includes glass fiber cloth and resin, wherein the glass fiber cloth serves as a skeleton to increase strength and support, and the resin is filled in the glass fiber cloth to provide adhesive effect. The dielectric constant of the resin is generally about 2 to about 3, while the dielectric constant of the glass fiber is about 6, and there is a larger difference in the dielectric constants of the two. Therefore, for differential signal lines, if a line of a differential line (D+) is distributed on the glass fiber bundles and a line of a differential line (D−) is distributed on the gap between the glass fiber bundles, the two lines in the differential line may generate different signal delays, resulting in skew distortion of the differential signal. The skew distortion causes an increase in the common mode voltage and a corresponding decrease in the differential signal, and a generated AC common mode effect becomes a source of crosstalk and electromagnetic interference in the system.

According to embodiments of the present disclosure, a laminated unit for a printed circuit board and a printed circuit board including the laminated unit are provided to solve or at least partially solve the above problems and other potential problems existing in the conventional solution. According to various embodiments of the present disclosure, by disposing at least one of two dielectric layers on both sides of the signal transmission layer as a resin isolation layer constructed from resin, the arrangement of the glass fiber cloth near the signal transmission layer may be reduced, thereby reducing the influence of the dielectric layers on the transmission quality of the signal transmission layer, in such a manner to improve the quality of signal transmitted by the signal transmission layer, so that the signal transmission layer may be applied to high-speed and high-frequency signal transmission. On the other hand, in order to ensure the overall strength of the printed circuit board under the premise of adding the resin isolation layer, reinforcing layers are further arranged on sides, opposite to the signal transmission layer, of a pair of reference layers arranged on two sides of the signal transmission layer, and the reinforcing layer is constructed by mixing the glass fiber inside the resin, so that the strength loss due to the resin isolation layer can be compensated for, thereby improving the reliability of the printed circuit board.

FIG. 1 illustrates a cross-sectional view of a printed circuit board 100 according to some embodiments of the present disclosure. As shown in FIG. 1, the printed circuit board 100 generally includes a plurality of laminated units 200 stacked in a thickness direction T. The plurality of laminated units 200 may be disposed in a chassis of a device and connected to various electronic devices or electrical components in the chassis, thereby facilitating supply of power or transmission of data to the plurality of electronic devices and the plurality of electrical components.

As shown in FIG. 1, each of the laminated units 200 includes a plurality of metal layers and a plurality of dielectric layers alternately stacked in a thickness direction T. Specifically, the plurality of metal layers are spaced apart by a predetermined distance in the thickness direction T and are arranged parallel to each other. A portion of metal layers is adapted to supply power or transmit signals to electronic devices or electrical components coupled to the printed circuit board 100, etc. Each of the plurality of dielectric layers is arranged between adjacent metal layers, respectively, and is adapted to provide skeletal support for the printed circuit board 100 and to establish insulation isolation between adjacent metal layers.

Figure 2:
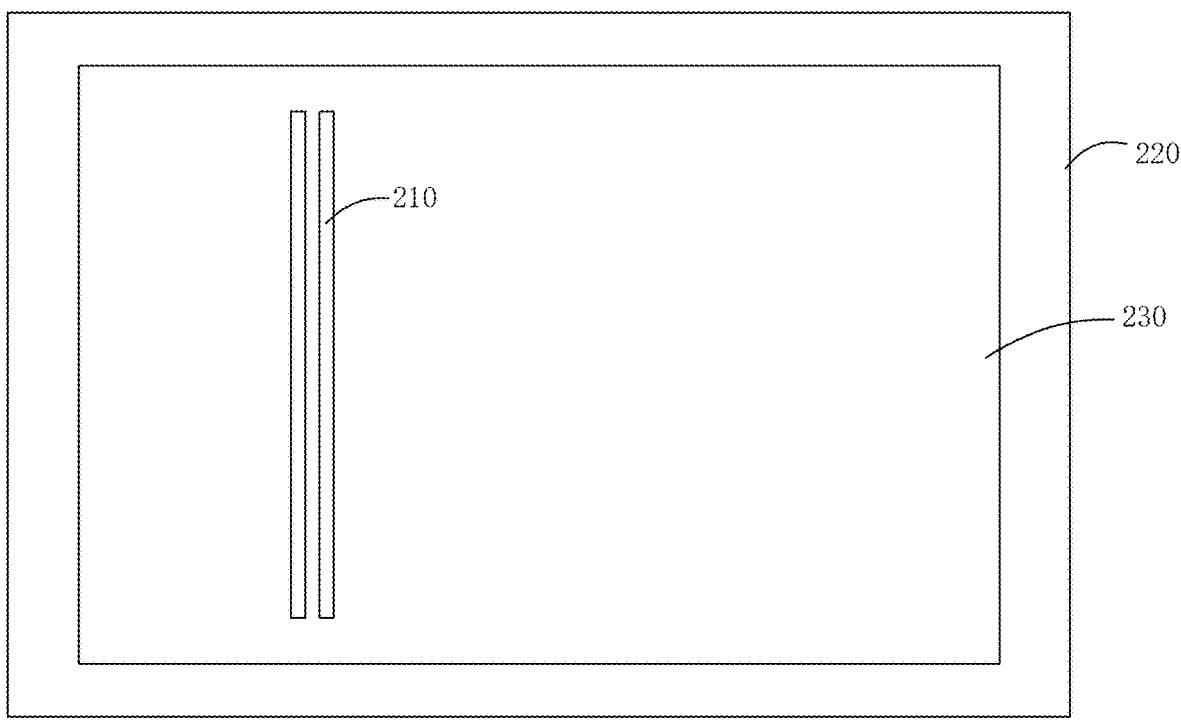
FIG. 2 illustrates a schematic view of a signal transmission layer according to some embodiments of the present disclosure.

As shown in FIG. 1, the plurality of metal layers includes a signal transmission layer 210 and a pair of reference layers 220 disposed on two sides of the signal transmission layer 210. FIG. 2 illustrates a schematic view of a signal transmission layer 210 according to some embodiments of the present disclosure. As shown in FIG. 2, in some embodiments, the metal in the reference layers 220 may form signal lines with predetermined shapes and thicknesses by etching, cutting, etc., and such signal lines may be electrically connected to a specific electronic device and electrical component coupled to the printed circuit board 100 to transmit electrical signal to the specific electronic device or electrical component. For example, the signal transmission layer 210 may include a pair of differential signal lines that may transmit differential signals to the electronic device.

As shown in FIG. 1 and FIG. 2, at least one of two dielectric layers adjacent to the signal transmission layer 210 is a resin isolation layer 230, and the resin isolation layer 230 is a solid layer formed by crosslinking and curing of resin. The resin isolation layer 230 may be filled in between the signal transmission layer 210 and the reference layers 220, and secure the signal transmission layer 210. Meanwhile, since the glass fiber is not used as the skeleton support in the resin isolation layer 230, the uniformity of electrical properties (such as dielectric constant and the like) at various locations in the resin isolation layer 230 is more uniform, thereby reducing interference to the signal transmission layer 210, and therefore making the signal (for example, the differential signal) transmitted in the signal transmission layer 210 more stable. Thus, the printed circuit board 100 can be used for high-speed and high-frequency signal transmission.

Figure 3A:
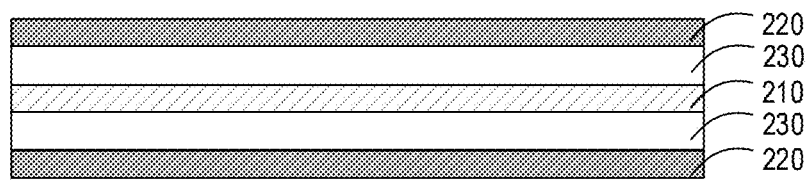
FIG. 3A and FIG. 3B respectively illustrate schematic views of an arrangement relationship of a signal transmission layer and an adjacent dielectric layer according to some embodiments of the present disclosure.
Figure 3B:
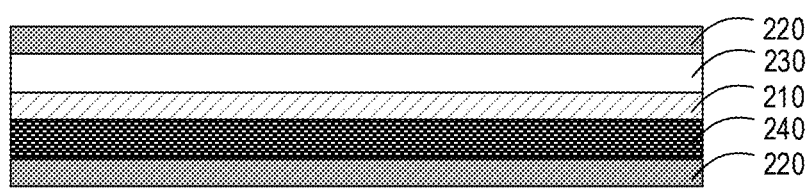

FIG. 3A and FIG. 3B respectively show schematic views of an arrangement relationship of the signal transmission layer 210 and an adjacent dielectric layer according to some embodiments of the present disclosure. In some embodiments, as shown in FIG. 3A, two dielectric layers adjacent to the signal transmission layer 210 both are resin isolation layers 230, thereby significantly reducing the influence of the glass fiber on quality of signal transmission. In some other embodiments, as shown in FIG. 3B, one of the two dielectric layers adjacent to the signal transmission layer 210 is the resin isolation layer 230, and the other is a reinforcing layer 240 constructed from a substrate and resin (the reinforcing layer 240 is described in more detail below). The combination use of the resin isolation layer 230 and the reinforcing layer 240 can retain the strength of the printed circuit board 100 to a certain extent while reducing the influence of the dielectric layer on the quality of signal transmission of the signal transmission layer 210, so as to ensure the durability of the printed circuit board 100. In some alternative embodiments, the user may also flexibly select the above two arrangements according to the signal rate and the system margin, or combine the above two arrangements in any suitable manner to meet requirements of the signal rate and/or the strength of the printed circuit board 100.

Returning to FIG. 1, dielectric layers on the sides of the pair of reference layers 220 opposite to the signal transmission layer 210 are reinforcing layers 240. As briefly mentioned above, the reinforcing layers 240 are solid layers formed by taking a substrate as a skeleton and resin as a filling material, and then being cured. It has a higher strength than the resin isolation layer 230. By arranging the reinforcing layers 240 on sides of the pair of reference layers 220 opposite to the signal transmission layer 210, the loss of strength of the printed circuit board 100 due to the use of the resin isolation layer 230 can be compensated for to a certain extent. Meanwhile, due to the isolation of the reference layers 220 from the electromagnetic wave, the arrangement of a glass fiber of the reinforcing layer 240 does not affect the normal transmission of the signal in the signal transmission layer 210.

In some embodiments, the substrate may be a glass fiber. The glass fiber includes a plurality of first glass fiber bundles extending in a first direction and second glass fiber bundles extending in a second direction. The plurality of first glass fiber bundles intersect with the plurality of second glass fiber bundles so that the glass fiber overall from a mesh structure, thereby increasing the strength of the glass fiber, and further increasing the structural strength of the printed circuit board 100. In some embodiments, the first direction and the second direction may form a predetermined angle. In some other embodiments, the first direction and the second direction may be perpendicular to each other. In some other embodiments, an angle such as 45°, 60°, 75°, or the like may be formed between the first direction and the second direction.

In some embodiments, predetermined angles are formed between the first direction, the second direction relative to the signal line in the signal transmission layer. For example, the first direction and the second direction are perpendicular to each other, and the first direction and the second direction respectively forms an angle of 45° relative to an extending direction of the signal line.

In some embodiments, the metal layers further include a power layer 250, and two dielectric layers adjacent to the power layer 250 are arranged as a structural layer 260. The structural layer 260 is constructed similarly to the reinforcing layer 240, using a mixture of a substrate and a resin material, thereby ensuring the overall structural strength of the printed circuit board 100.

In some embodiments, the arrangement density of the glass fiber in the reinforcing layer 240 is greater than the arrangement density of the glass fiber in the structural layer 260. For example, a spacing between a plurality of first glass fiber bundles extending in a first direction in the reinforcing layer 240 is less than that between a plurality of first glass fiber bundles extending in the first direction in the structural layer 260, and/or a spacing between a plurality of second glass fiber bundles extending in a second direction in the reinforcing layer 240 is less than that between a plurality of second glass fiber bundles extending in the second direction in the structural layer 260. The arrangement of the glass fiber in the reinforcing layer 240 is denser, on one hand, the strength of a portion of the reinforcing layer 240 is improved, and on the other hand, the uniformity of electrical performance at various locations of the reinforcing layer 240 is also improved, thereby further reducing the influence of the dielectric layers on the stability of the transmission signal.

In some embodiments, a weight ratio of glass fiber to resin in the reinforcing layer 240 exceeds a weight ratio of glass fiber to resin in the structural layer 260, that is, more glass fibers are used in the reinforcing layer 240 to improve the strength, so that the reinforcing layer 240 can compensate for the strength loss due to the resin isolation layer 230, so that the overall mechanical strength of the printed circuit board 100 is more uniform.

Figure 4:
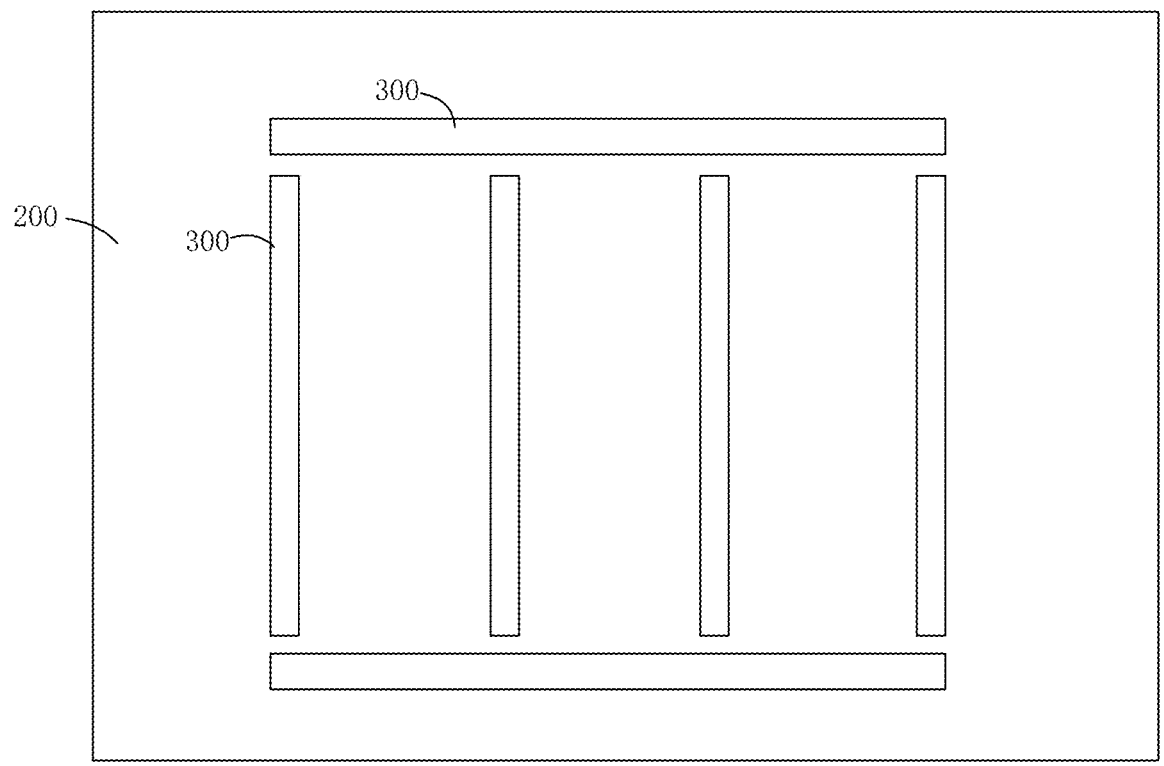
FIG. 4 illustrates a schematic view of an overall structure of a printed circuit board according to some embodiments of the present disclosure.

FIG. 4 shows a schematic view of an overall structure of the printed circuit board 100 according to some embodiments of the present disclosure. As shown in FIG. 4, in some embodiments, the printed circuit board 100 further includes a reinforcing rib 300 arranged on a side of the plurality of laminated units 200 in the thickness direction T, and the reinforcing rib 300 extends in an arrangement direction perpendicular to the thickness direction T. In some embodiments, the reinforcing rib 300 may be made of a metal material, the reinforcing rib 300 may be secured to the laminated units 200 in a manner such as bonding and the like, and the provision of the reinforcing rib 300 can improve the overall strength of the printed circuit board 100. In some embodiments, the reinforcing rib 300 may also be coupled into a chassis of the device, thereby securing the printed circuit board 100 into the chassis of the device by the reinforcing rib 300.

In some embodiments, an arrangement direction of the reinforcing ribs 300 may be a horizontal direction or a vertical direction perpendicular to the thickness direction T. In some other embodiments, the arrangement direction of the reinforcing rib 300 may also be any suitable curve direction. For example, the reinforcing rib 300 may extend horizontally or vertically along a straight line, or the reinforcing rib 300 may extend along a curve.

In some embodiments, at least one reinforcing layer 240 and/or at least one structural layer 260 is arranged between two signal transmission layers 210 adjacent to each other in the thickness direction T, in such way, it is possible to avoid the situation of localized insufficiency of strength inside the printed circuit board 100 due to the centralized arrangement of the resin isolation layer 230.

Embodiments of the present disclosure are also embodied in the following examples.

Example 1. A laminated unit for a printed circuit board, including: a plurality of metal layers and a plurality of dielectric layers alternately stacked in a thickness direction, wherein the plurality of metal layers includes a signal transmission layer and a pair of reference layers disposed on two sides of the signal transmission layer;

at least one of two dielectric layers adjacent to the signal transmission layer includes a resin isolation layer; and the dielectric layers on sides of the pair of reference layers opposite to the signal transmission layer include a reinforcing layer, and the reinforcing layer includes a substrate and a resin material arranged around the substrate.

Example 2. The laminated unit of example 1, wherein one of the two dielectric layers adjacent to the signal transmission layer includes the resin isolation layer, and the other dielectric layer includes the reinforcing layer.

Example 3. The laminated unit of example 2, wherein the plurality of metal layers further includes a power layer, two dielectric layers adjacent to the power layer include a structural layer, and the structural layer includes a substrate and a resin material arranged around the substrate.

Example 4. The laminated unit of Example 3, wherein the substrates in the reinforcing layer and the structural layer include a glass fiber, the glass fiber includes a plurality of first glass fiber bundles extending in a first direction and a plurality of second glass fiber bundles extending in a second direction, and the plurality of first glass fiber bundles intersect with the plurality of second glass fiber bundles to cause the glass fiber to form a mesh structure.

Example 5. The laminated unit of example 4, wherein the first direction or the second direction forms a predetermined angle with an extending direction of a signal line in the signal transmission layer.

Example 6. The laminated unit of example 4 or 5, wherein an arrangement density of the glass fiber in the reinforcing layer exceeds an arrangement density of the glass fiber in the structural layer.

Example 7. The laminated unit of example 4 or 5, wherein a weight ratio of glass fiber to resin in the reinforcing layer exceeds a weight ratio of glass fiber to resin in the structural layer.

Example 8. The laminated unit of example 3, wherein at least one reinforcing layer and/or at least one structural layer is arranged between two signal transmission layers adjacent to each other in the thickness direction.

Example 9. A printed circuit board including a plurality of laminated units of any of examples 1-8, and the plurality of laminated units being stacked in the thickness direction.

Example 10. The printed circuit board of example 9, further including a reinforcing rib arranged on at least one side of the plurality of laminated units in the thickness direction and arranged to extend in an arrangement direction perpendicular to the thickness direction.

Various implementations of the present disclosure have been described above, which are exemplary, not exhaustive, and are not limited to the implementations disclosed. Many modifications and variations will be apparent to those of ordinary skill in the art without departing from the scope and spirit of the various implementations illustrated. The selection of the terms used herein is intended to best explain the principles of the implementations, practical applications, or improvements to techniques in the marketplace, or to enable others of ordinary skill in the art to understand the various implementations disclosed herein.

We claim:

1. A laminated unit for a printed circuit board, comprising: a plurality of metal layers and a plurality of dielectric layers alternately stacked in a thickness direction,
    wherein the plurality of metal layers comprise a signal transmission layer and a pair of reference layers disposed on two sides of the signal transmission layer;
    at least one of two dielectric layers adjacent to the signal transmission layer comprises a resin isolation layer; and
    dielectric layers on sides of the pair of reference layers opposite to the signal transmission layer comprise a reinforcing layer, and the reinforcing layer comprises a substrate and a resin material arranged around the substrate,
    wherein one of the two dielectric layers adjacent to the signal transmission layer comprises the resin isolation layer, and the other dielectric layer comprises the reinforcing layer.

2. The laminated unit of claim 1, wherein the plurality of metal layers further comprises a power layer, two dielectric layers adjacent to the power layer comprise a structural layer, and the structural layer comprises a substrate and a resin material arranged around the substrate.

3. The laminated unit of claim 2, wherein the substrates in the reinforcing layer and the structural layer comprise a glass fiber, the glass fiber comprises a plurality of first glass fiber bundles extending in a first direction and a plurality of second glass fiber bundles extending in a second direction, and the plurality of first glass fiber bundles intersect with the plurality of second glass fiber bundles to cause the glass fiber to form a mesh structure.

4. The laminated unit of claim 3, wherein the first direction or the second direction forms a predetermined angle with an extending direction of a signal line in the signal transmission layer.

5. The laminated unit of claim 3, wherein an arrangement density of the glass fiber in the reinforcing layer exceeds an arrangement density of the glass fiber in the structural layer.

6. The laminated unit of claim 3, wherein a weight ratio of glass fiber to resin in the reinforcing layer exceeds a weight ratio of glass fiber to resin in the structural layer.

7. The laminated unit of claim 2, wherein at least one reinforcing layer and/or at least one structural layer is arranged between two signal transmission layers adjacent to each other in the thickness direction.

8. A printed circuit board comprising a plurality of laminated units stacked in a thickness direction, wherein each of the plurality of laminated units comprises: a plurality of metal layers and a plurality of dielectric layers alternately stacked in the thickness direction,
    wherein the plurality of metal layers comprise a signal transmission layer and a pair of reference layers disposed on two sides of the signal transmission layer;
    at least one of two dielectric layers adjacent to the signal transmission layer comprises a resin isolation layer; and
    dielectric layers on sides of the pair of reference layers opposite to the signal transmission layer comprise a reinforcing layer, and the reinforcing layer comprises a substrate and a resin material arranged around the substrate,
    wherein one of the two dielectric layers adjacent to the signal transmission layer comprises the resin isolation layer, and the other dielectric layer comprises the reinforcing layer.

9. The printed circuit board of claim 8, further comprising a reinforcing rib arranged on at least one side of the plurality of laminated units in the thickness direction and arranged to extend in an arrangement direction perpendicular to the thickness direction.

10. The printed circuit board of claim 8, wherein the plurality of metal layers further comprises a power layer, two dielectric layers adjacent to the power layer comprise a structural layer, and the structural layer comprises a substrate and a resin material arranged around the substrate.

11. The printed circuit board of claim 10, wherein the substrates in the reinforcing layer and the structural layer comprise a glass fiber, the glass fiber comprises a plurality of first glass fiber bundles extending in a first direction and a plurality of second glass fiber bundles extending in a second direction, and the plurality of first glass fiber bundles intersect with the plurality of second glass fiber bundles to cause the glass fiber to form a mesh structure.

12. The printed circuit board of claim 11, wherein the first direction or the second direction forms a predetermined angle with an extending direction of a signal line in the signal transmission layer.

13. The printed circuit board of claim 11, wherein an arrangement density of the glass fiber in the reinforcing layer exceeds an arrangement density of the glass fiber in the structural layer.

14. The printed circuit board of claim 11, wherein a weight ratio of glass fiber to resin in the reinforcing layer exceeds a weight ratio of glass fiber to resin in the structural layer.

15. The printed circuit board of claim 10, wherein at least one reinforcing layer and/or at least one structural layer is arranged between two signal transmission layers adjacent to each other in the thickness direction.

* * * * *